United States Patent
Goto

(10) Patent No.: US 10,272,516 B2
(45) Date of Patent: Apr. 30, 2019

(54) THREE-DIMENSIONAL SHAPING APPARATUS, CONTROL METHOD OF THREE-DIMENSIONAL SHAPING APPARATUS, AND CONTROL PROGRAM OF THREE-DIMENSIONAL SHAPING APPARATUS

(71) Applicant: TECHNOLOGY RESEARCH ASSOCIATION FOR FUTURE ADDITIVE MANUFACTURING, Tokyo (JP)

(72) Inventor: Kazuya Goto, Tokyo (JP)

(73) Assignee: TECHNOLOGY RESEARCH ASSOCIATION FOR FUTURE ADDITIVE MANUFACTURING, Tokyo (JP)

( * ) Notice: Subject to any disclaimer, the term of this patent is extended or adjusted under 35 U.S.C. 154(b) by 184 days.

(21) Appl. No.: 15/120,643

(22) PCT Filed: Dec. 7, 2015

(86) PCT No.: PCT/JP2015/084249
§ 371 (c)(1),
(2) Date: Aug. 22, 2016

(87) PCT Pub. No.: WO2017/098548
PCT Pub. Date: Jun. 15, 2017

(65) Prior Publication Data
US 2018/0015565 A1  Jan. 18, 2018

(51) Int. Cl.
B22F 3/105 (2006.01)
B23K 15/00 (2006.01)
(Continued)

(52) U.S. Cl.
CPC ........ *B23K 15/0086* (2013.01); *B23K 15/002* (2013.01); *B23K 15/02* (2013.01);
(Continued)

(58) Field of Classification Search
CPC .... B33Y 30/00; B33Y 50/02; B23K 15/0086; B23K 15/002; B23K 15/02; B29C 64/393;
(Continued)

(56) References Cited

U.S. PATENT DOCUMENTS 7,537,722 B2   5/2009  Andersson et al.
2016/0339536 A1  11/2016  Goto

FOREIGN PATENT DOCUMENTS

EP    3 059 031 A1    8/2016
JP    2003-531034 A  10/2003
(Continued)

OTHER PUBLICATIONS

Extended European Search Report (ESR) dated Jan. 5, 2018 in connection with corresponding EP Application No. 15899112.5.
(Continued)

*Primary Examiner* — Christopher S Kim
(74) *Attorney, Agent, or Firm* — Ladas & Parry LLP

(57) ABSTRACT

Overheating of and unintended melting of powder is suppressed, and thus the shaping accuracy is improved. A three-dimensional shaping apparatus includes an electron gun that generates an electron beam, at least one primary deflector that deflects the electron beam one- or two-dimensionally, at least one lens that is provided between the electron gun and the primary deflector and focuses the electron beam, a secondary deflector that is provided between the electron gun and the primary deflector, and deflects the electron beam one- or two-dimensionally, and a controller that controls the deflection directions and scan-
(Continued)

ning speeds of the primary deflector and the second deflector. The controller controls the deflection direction and scanning speed of the second deflector while the scanning speed of the primary deflector is lower than a predetermined speed.

7 Claims, 9 Drawing Sheets

(51) Int. Cl.
*B23K 15/02* (2006.01)
*B33Y 30/00* (2015.01)
*B33Y 50/02* (2015.01)
*B29C 64/153* (2017.01)
*B29C 64/268* (2017.01)
*B29C 64/393* (2017.01)

(52) U.S. Cl.
CPC .......... *B29C 64/268* (2017.08); *B29C 64/393* (2017.08); *B33Y 30/00* (2014.12); *B33Y 50/02* (2014.12); *B22F 3/1055* (2013.01); *B22F 2003/1056* (2013.01); *B29C 64/153* (2017.08); *Y02P 10/295* (2015.11)

(58) Field of Classification Search
CPC ... B29C 64/268; B29C 64/153; Y02P 10/295; B22F 3/1055; B22F 2003/1056
See application file for complete search history.

(56) References Cited

FOREIGN PATENT DOCUMENTS

| | | |
|---|---|---|
| JP | 2004-78026 A | 3/2004 |
| JP | 2015-170571 A | 9/2015 |
| WO | 01/81031 A1 | 11/2001 |

OTHER PUBLICATIONS

Patent Abstracts of Japan English abstract of JP 2004-78026 A.
International Search Report (ISR) dated Feb. 23, 2016 for International Application No. PCT/JP2015/084249.
Written Opinion (WO) dated Feb. 23, 2016 for International Application No. PCT/JP2015/084249.
J-PlatPat English abstract of JP 2015-170571 A.

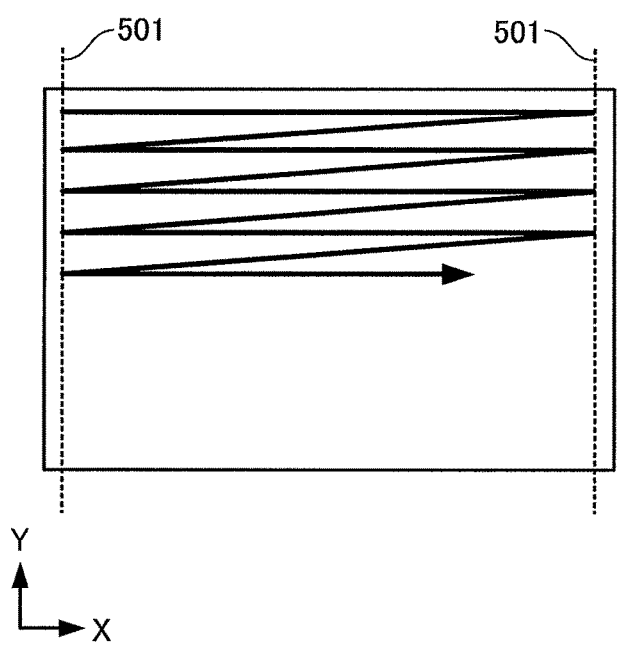
F I G. 5

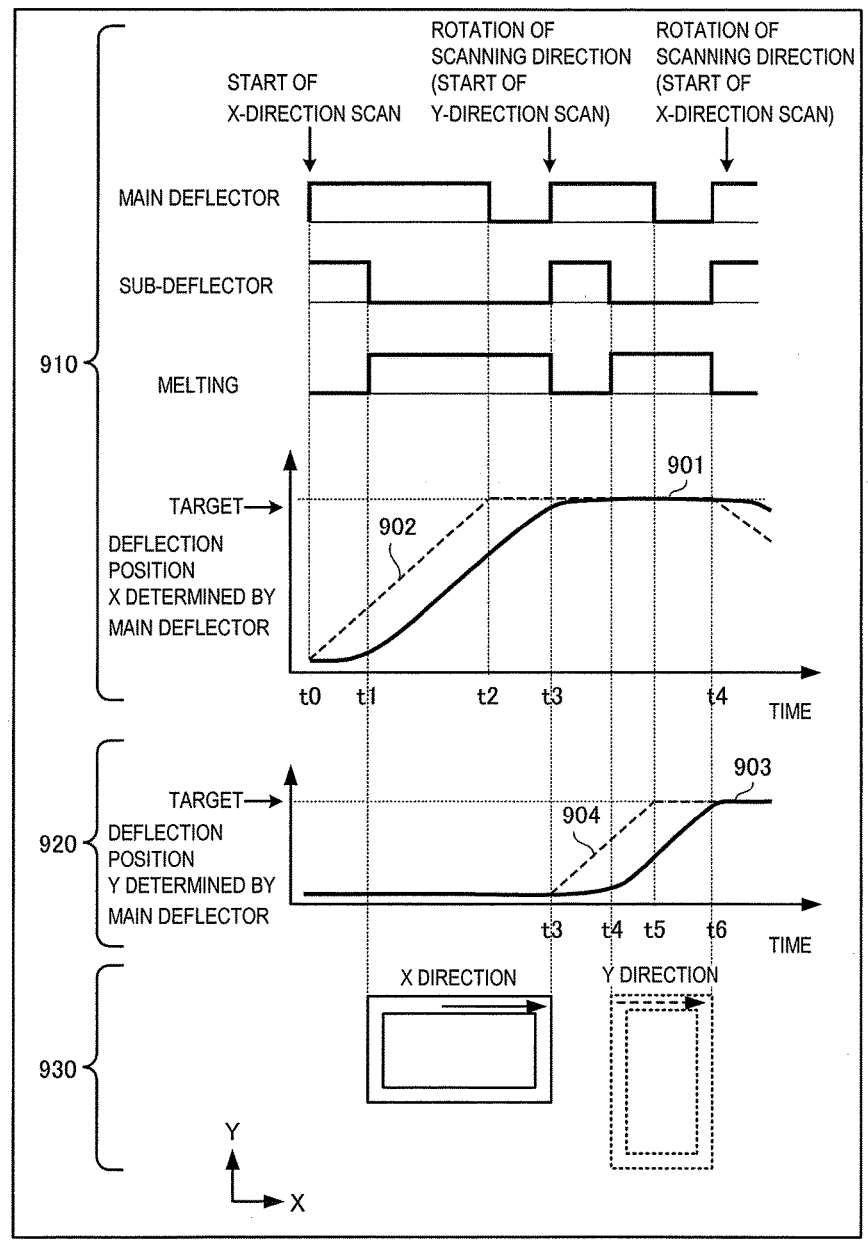
F I G. 9

THREE-DIMENSIONAL SHAPING APPARATUS, CONTROL METHOD OF THREE-DIMENSIONAL SHAPING APPARATUS, AND CONTROL PROGRAM OF THREE-DIMENSIONAL SHAPING APPARATUS

RELATED APPLICATION

This application is an application under 35 U.S.C. 371 of International Application No. PCT/JP2015/084249 filed on Dec. 7, 2015, the entire contents of which are incorporated herein by reference.

TECHNICAL FIELD

The present invention relates to a three-dimensional shaping apparatus, a control method of the three-dimensional shaping apparatus, and a control program of the three-dimensional shaping apparatus.

BACKGROUND ART

In the above technical field, patent literature 1 discloses a three-dimensional product manufacturing apparatus that scans powder with an electron beam.

CITATION LIST

Patent Literature

Patent literature 1: Japanese PCT National Publication No. 2003-531034

SUMMARY OF THE INVENTION

Technical Problem

In the technique described in the above literature, however, it takes time for the scanning speed of a deflector to reach a predetermined scanning speed. This causes the powder to be overheated and suffer from unintended melting, thereby making it impossible to improve the shaping accuracy.

The present invention enables one to provide a technique of solving the above-described problem.

Solution to Problem

One aspect of the present invention provides a three-dimensional shaping apparatus comprising:
an electron gun that generates an electron beam;
at least one primary deflector that deflects the electron beam one- or two-dimensionally;
at least one lens that is provided between the electron gun and the primary deflector, and focuses the electron beam;
a secondary deflector that is provided between the electron gun and the primary deflector, and deflects the electron beam one- or two-dimensionally; and
a controller that controls the deflection directions and scanning speeds of the primary deflector and of the secondary deflector,
wherein the controller controls the deflection direction and scanning speed of the secondary deflector while the scanning speed of the primary deflector is lower than a predetermined speed.

Another aspect of the present invention provides a control method of a three-dimensional shaping apparatus, the method comprising:
generating an electron beam;
causing a primary deflector to deflect the electron beam one- or two-dimensionally; and
causing a secondary deflector to deflect the electron beam one- or two-dimensionally when causing the primary deflector to change the deflection direction of the electron beam.

Still another aspect of the present invention provides a control program of a three-dimensional shaping apparatus, the program causing a computer to execute a method comprising:
generating an electron beam;
causing a primary deflector to deflect the electron beam one- or two-dimensionally; and
causing a secondary deflector to deflect the electron beam one- or two-dimensionally when causing the primary deflector to change the deflection direction of the electron beam.

Advantageous Effects of Invention

The present invention suppresses overheating of and unintended melting of the powder, making it possible to improve the shaping accuracy.

BRIEF DESCRIPTION OF DRAWINGS

FIG. 5 is a view showing points where the speed vector of the scan by the main deflector 102 of the three-dimensional shaping apparatus is changed according to the first embodiment of the present invention;

FIG. 9 is a view explaining the operation of the three-dimensional shaping apparatus according to the fourth embodiment of the present invention.

DESCRIPTION OF THE EMBODIMENTS

Preferred embodiments of the present invention will now be described in detail with reference to the drawings. It should be noted that the relative arrangement of the components, the numerical expressions, and the numerical values set forth in these embodiments do not limit the scope of the present invention unless stated otherwise specifically.

First Embodiment

A three-dimensional shaping apparatus 100 according to the first embodiment of the present invention will be described with reference to FIGS. 1 to 5. The three-dimensional shaping apparatus 100 is an apparatus that shapes three-dimensional objects by laminating materials such as metal powder, which materials are melted and solidified by irradiating them with an electron beam.

Figure 1:
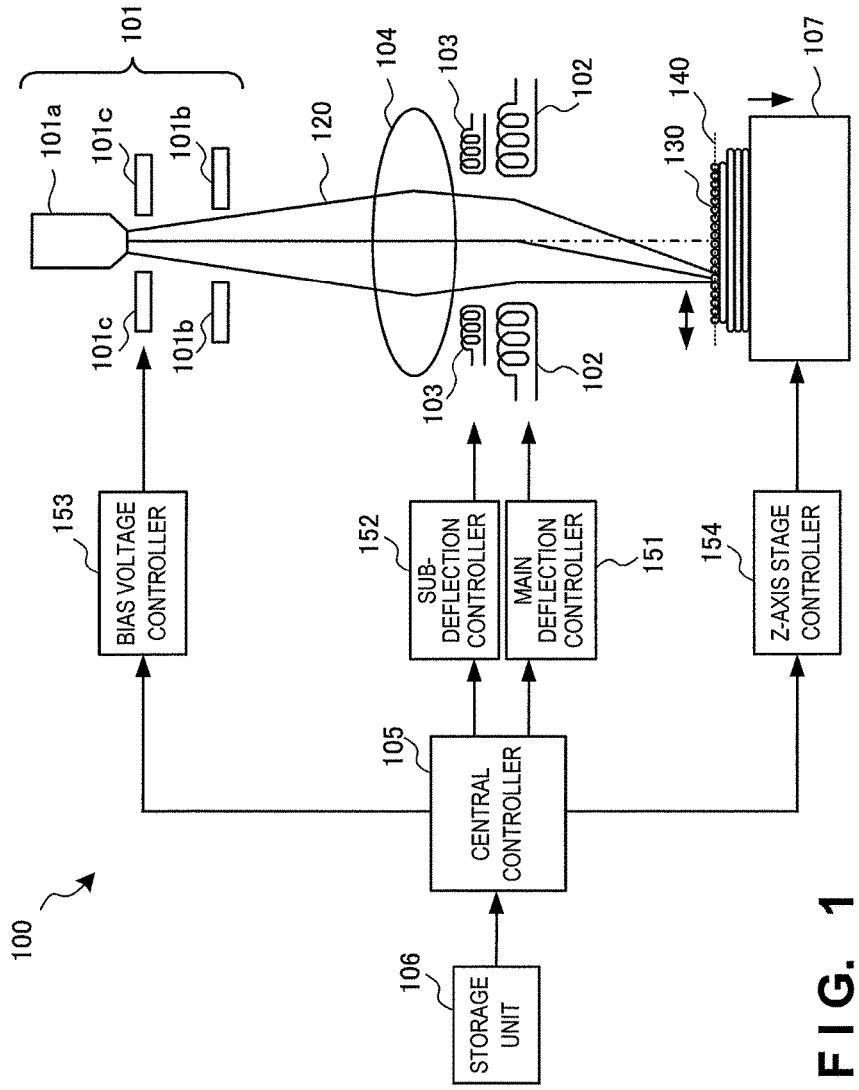
FIG. 1 is a view showing the configuration of a three-dimensional shaping apparatus according to the first embodiment of the present invention.

FIG. 1 is a view showing the configuration of the three-dimensional shaping apparatus 100 according to this embodiment. The three-dimensional shaping apparatus 100 includes an electron gun 101, a main deflector 102, a sub-deflector 103, a lens 104, a central controller 105, a storage unit 106, and a Z-axis stage 107. The three-dimensional shaping apparatus 100 further includes a main deflection controller 151, a sub-deflection controller 152, a bias voltage controller 153, and a Z-axis stage controller 154.

The three-dimensional shaping apparatus 100 uses the main deflector 102 and the sub-deflector 103 to deflect the electron beam 120. Both the main deflector 102 and the sub-deflector 103 are electromagnetic multipole deflectors, and each deflector includes X-direction deflection coils and Y-direction deflection coils.

The deflection area, that is, the maximum shaping area of the main deflector 102, is a 200-mm square. The movable range of the Z-axis stage 107, that is, the maximum shaping depth, is 200 mm. The deflection area of the sub-deflector 103 is a 2-mm square, which is much smaller than the deflection area of the main deflector 102.

The main deflection controller 151 is connected to the main deflector 102, the sub-deflection controller 152 is connected to the sub-deflector 103, the bias voltage controller 153 is connected to the grid 101c, and the Z-axis stage controller 154 is connected to the Z-axis stage 107. The main deflection controller 151, sub-deflection controller 152, bias voltage controller 153, and Z-axis stage controller 154 each are also connected to the central controller 105. The storage unit 106 is connected to the central controller 105. The storage unit 106 stores data representing the shapes of three-dimensional structures, and data representing the conditions for shaping the structures.

The three-dimensional shaping apparatus 100 spreads metal powder 130 over the shaping plane 140, and then generates the electron beam 120 with the electron gun 101. The three-dimensional shaping apparatus 100 then focuses the electron beam 120 with the lens 104, and uses the main deflector 102 to deflect the electron beam 120 to have it incident on a desired position on the shaping plane 140, so that the metal powder 130 at the desired position is melted and solidified with the electron beam 120. The three-dimensional shaping apparatus 100 also compensates for an increase in the height of the three-dimensional object in process, which increase results from the melting and solidification of the metal powder 130, by moving the Z-axis stage 107 downward.

The operations of the individual controllers during the above operation are as follows. The central controller 105 acquires the data stored in the storage unit 106. The central controller 105, based on the acquired data, controls the main deflection controller 151, sub-deflection controller 152, bias voltage controller 153, and Z-axis stage controller 154. More specifically, the central controller 105 operates the main deflector 102 via the main deflection controller 151, and operates the sub-deflector 103 via the sub-deflection controller 152. The central controller 105 increases or decreases the current of the electron beam 120 by changing the bias voltage via the bias voltage controller 153. Furthermore, the central controller 105 moves the Z-axis stage 107 via the Z-axis stage controller 154 by a necessary moving step.

Figure 2:
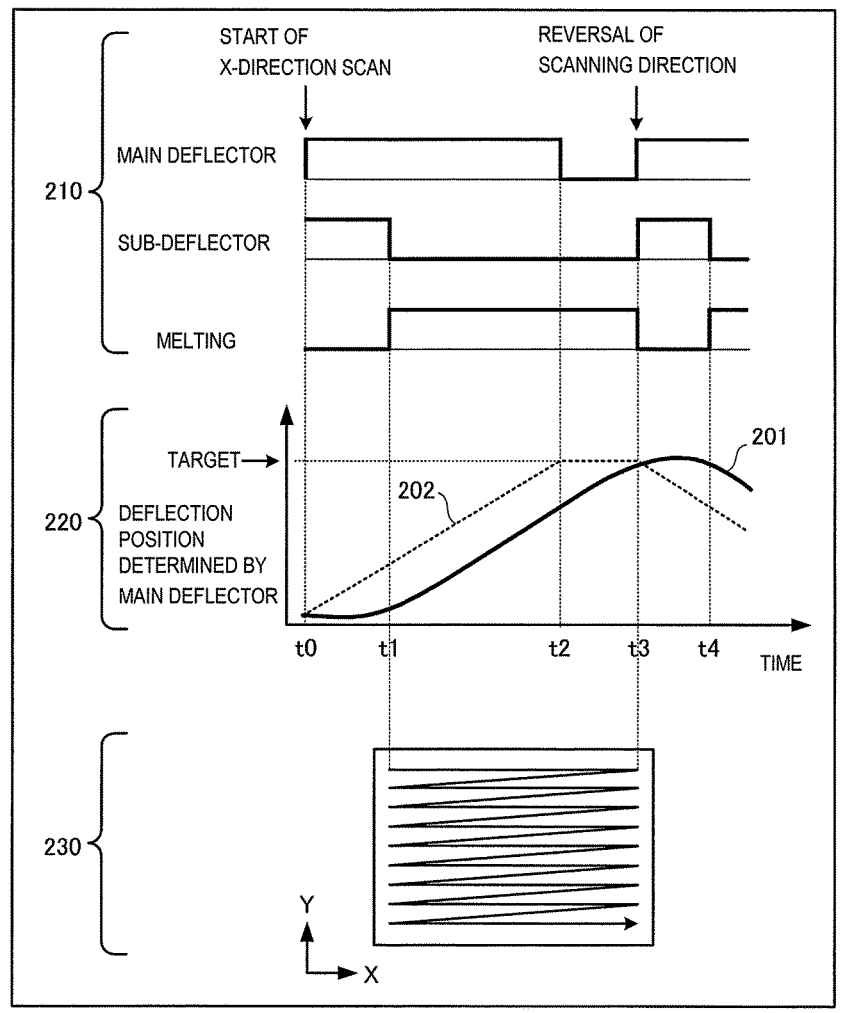
FIG. 2 is a view explaining the operation of the three-dimensional shaping apparatus according to the first embodiment of the present invention.

FIG. 2 is a view explaining the operation of the three-dimensional shaping apparatus 100. In FIG. 2, 210 is a timing chart representing the timings of the scanning signal inputs to the main deflector 102 and sub-deflector 103, and the timing of melting, and 220 is a timing chart showing the relationship between the time and the deflection position (the incident position of the electron beam 120 on the shaping plane 140) determined by the main deflector 102. In FIG. 2, in addition, 230 is a view showing a region scanned by the main deflector 102. The region is, more specifically, a region where the metal powder 130 is melted and which is scanned by repeating a high-speed reciprocating scan in the X direction and shifting it, during its repetition, by a small step in the Y direction.

Note that 210 and 220 of FIG. 2 do not show the scan over the entire region shown in 230 of FIG. 2 but only show part of the scan. More specifically, they show the process, during a given time period, of scanning the region from left to right in the X direction and then reversing the scanning direction.

The operation of the three-dimensional shaping apparatus 100 is basically the same as that of a conventional three-dimensional shaping apparatus that uses a main deflector to scan a material with an electron beam, but the former is different from the latter in that in the former, unlike in the latter, the sub-deflector 103 is operated. In this embodiment, the sub-deflector 103 is operated while, after the scanning signal input to the main deflector 102 starts or restarts, the scanning speed of the main deflector 102 is temporarily lower than a desired scanning speed. This can diffuse heat given to the metal powder 130 in the region which receives the electron beam 120, thereby suppressing the temperature rise of the metal powder 130.

The operations of the main deflector 102 and sub-deflector 103 according to this embodiment will be described in detail below using times t0, t1, t2, t3, and t4 in 220 of FIG. 2. In the following description, the scanning signals refer to the deflection signals input to the main deflector 102 and sub-deflector 103 with their strength changing rates being nonzero. That is, if the strength of a deflection signal is nonzero but if its changing rate is zero, the strength of the scanning signal is zero and scanning signal input is being stopped. Note that during a period from when the scanning signal input stops to when the next scanning signal input starts, the main deflector 102 receives a deflection signal having a strength equal to that of when the scanning signal input stops, but the sub-deflector 103 receives a deflection signal having a strength of zero.

As shown in 210 and 220 of FIG. 2, before time t0, the scanning signal input to the main deflector 102 is off but the scanning signal input to the sub-deflector 103 is on. At time t0, the X-direction scanning signal input to the main deflector 102 is turned on to start the X-direction scan by the main deflector 102. After that, at time t1, the scanning signal input to the sub-deflector 103 is turned off to start melting of the metal powder 130. At time t2, the scanning signal input to the main deflector 102 is turned off. At time t3, the scanning signal input to the sub-deflector 103 is turned on to end the melting. Furthermore, at time t3, the X-direction scanning signal input to the main deflector 102 is turned on again, and the X-direction scan by the main deflector 102 restarts. Note here that the X-direction scan is restarted by a scanning signal for the scan direction opposite to that in the previous scan in order to reverse the scanning direction. At time t4, the scanning signal input to the sub-deflector 103 is turned off.

After the X-direction scan by the main deflector 102 starts, that is, after the X-direction scanning signal input to the main deflector 102 starts (from time t0 to t1) as described above, the deflection position (solid line 201) determined by the main deflector 102 is delayed with respect to the ideal deflection position (broken line 202), as shown in 220 of FIG. 2. As a result, the deflection by the main deflector 102 continues for a period equal to the above delay time even after the scanning signal input to the main deflector 102 is stopped (from time t2 to t3), and finally the deflection position converges to the target position.

The delay in the deflection position determined by the main deflector 102 is due to the response of the main deflector 102 and of its driving circuit (amplifier). That is, in the above descriptions, the scanning signal input to the main deflector 102 is, more directly put, the scanning signal input to the driving circuit of the main deflector 102, and the current flowing through the coils forming the main deflector 102 is delayed with respect to the input. From the scanning speed of the main deflector 102 in the above-described operation, it follows that after the scanning signal input to the main deflector 102 starts (from time t0 to t1), the scanning speed (the gradient of the solid line 201) of the main deflector 102 becomes lower than the ideal scanning speed (the gradient of the broken line 202), as shown in 220 of FIG. 2. The scanning speed of the main deflector 102 is also low during some period after the series of processes of stopping the scanning signal input to the main deflector 102, leaving the deflection continued for a while, and restarting the scanning signal input (from time t3 to t4).

If the sub-deflector 103 is, as mentioned above, not operated while the scanning speed of the main deflector 102 is low, that is, not operated for the period after the scanning signal input to the main deflector 102 starts or restarts, the metal powder 130 in the region which receives the electron beam 120 is given more heat per unit area. That is, the metal powder 130 is overheated.

According to this principle, the regions where the metal powder 130 is overheated are located at or near the points at which the direction of the scan by the main deflector 102 is reversed. Referring to 230 of FIG. 2, regions where the metal powder 130 is overheated exist along the Y-direction edges the rectangular region where the metal powder 130 is melted. That is, the regions where the metal powder 130 is overheated exist along the Y-direction boundary lines between the region where the metal powder 130 is melted and the region where the metal powder 130 is not melted.

The overheating causes unintended melting, thereby degrading the shaping accuracy. The overheating, furthermore, increases the evaporation amount of the metal powder 130 to an excessive degree, and decreases the thickness of a metal layer formed by the metal powder 130 being solidified. The decrease of the thickness of the metal layer can be compensated for in the following step of newly spreading the metal powder 130 over the metal layer, but the increase in the evaporation amount of the metal powder 130 causes a problem that it increases the speed at which an evaporated metal film is formed on the inner wall of the three-dimensional shaping apparatus 100. This increases the speed at which the inner wall becomes contaminated and thus increases the ease with which the evaporated metal film flakes off. If the evaporated metal film flakes off onto the shaping plane 140, the metal powder 130 beneath the film is prevented from being melted as expected.

In contrast, if, as described above, the sub-deflector 103 is operated while the scanning speed of the main deflector 102 is low after the scanning signal input to the main deflector 102 starts or restarts, the heat given to the metal powder 130 in the region which receives the electron beam 120 is diffused. This suppresses overheating of the metal powder 130, thereby preventing the above-described problems. Note that the scanning speed of the sub-deflector 103 may be set higher or lower than that of the main deflector 102, and can be changed as needed.

If furthermore one, before the scanning signal input to the main deflector 102 starts or restarts, leaves the deflection by the main deflector 102 continued for a while after the scanning signal input to the main deflector 102 is stopped (from time t2 to t3) and allows the deflection position to converge to the target position as described above, the position accuracy of the boundary between the region where the metal powder 130 is melted and the region where the metal powder 130 is not melted is improved, and thus the shaping accuracy is increased.

In the above operation, the timing at which the scanning signal input to the main deflector 102 starts or restarts is the timing at which the scanning direction is reversed, that is, the timing at which the speed vector of the scan by the main deflector 102 is changed. Therefore, in this embodiment, it is after the speed vector of the scan by the main deflector 102 is changed that the sub-deflector 103 is operated.

Figure 3:
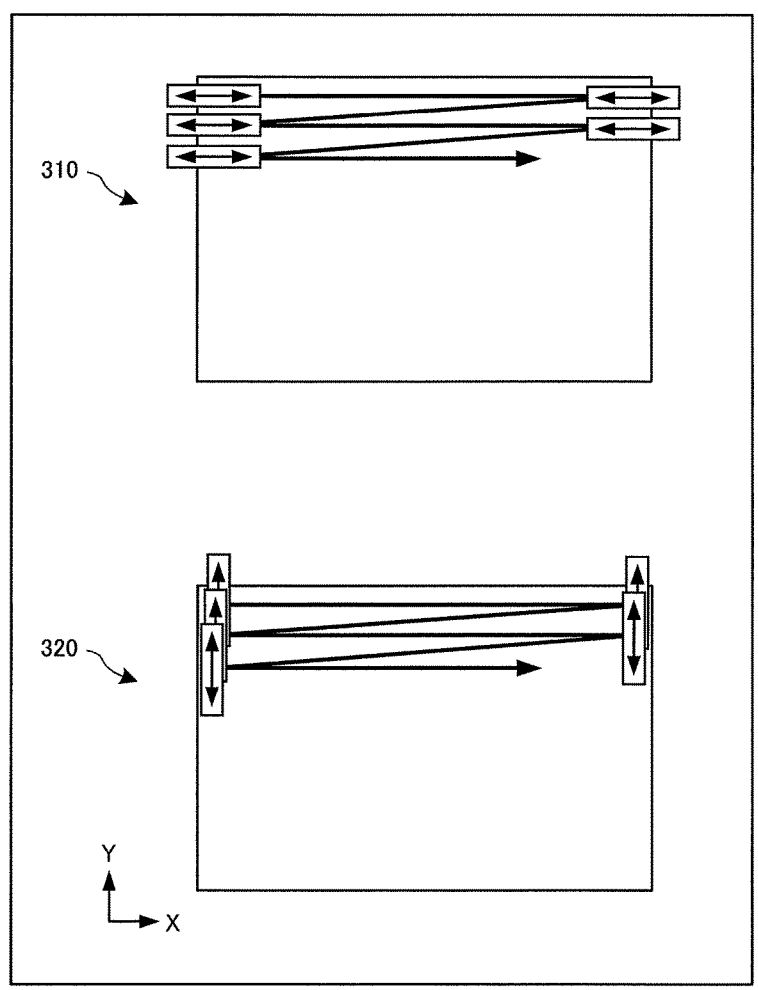
FIG. 3 is a view showing an example of the deflection area of the sub-deflector of the three-dimensional shaping apparatus according to the first embodiment of the present invention.

FIG. 3 is a view showing an example of the deflection area (one-dimensional) of the sub-deflector 103 of the three-dimensional shaping apparatus 100 according to this embodiment. The deflection area of the sub-deflector 103 is originally a square (two-dimensional), as described above. In the above operation, however, the deflection area of the sub-deflector 103 may be one-dimensional, as shown in FIG. 3. That is, the direction of the scan by the sub-deflector 103 may be the X direction, as shown in 310 of FIG. 3. However, if the direction of the scan by the sub-deflector 103 is the Y direction as shown in 320 of FIG. 3, repeating the process of reversing the scan and diffusing the heat at the X-coordinates where the direction of the X-direction scan by the main deflector 102 is reversed (the boundary between the region where the metal powder 130 is melted and the region where the metal powder 130 is not melted) results in the deflection areas of the sub-deflector 103, that is, the heat diffusion areas, overlapping one another at the above-described Y-direction edges. Therefore the heat supposed to be diffused by the sub-deflector 103 is accumulated at the Y-direction edges and, as a result, the heat is not diffused. Consequently, it is impossible to prevent overheating of the metal powder 130 within the deflection area of the sub-deflector 103.

Figure 4:
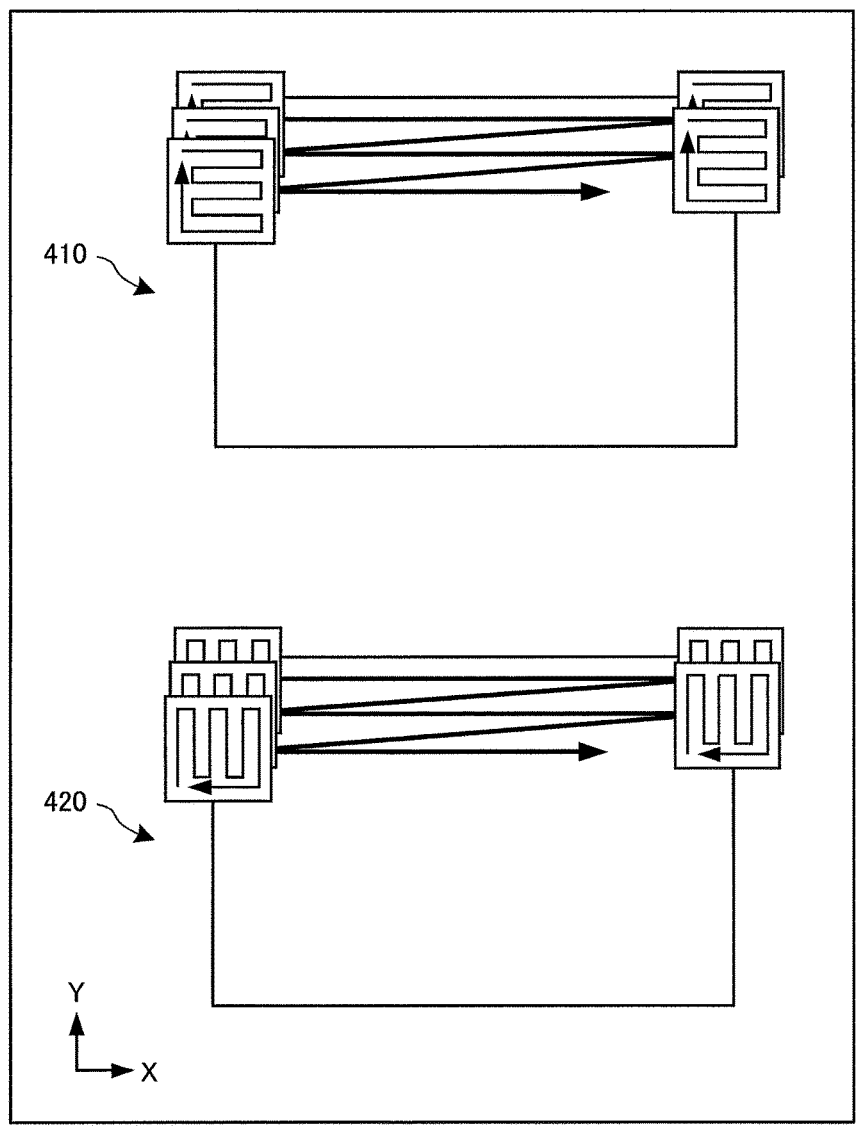
FIG. 4 is a view showing another example of the deflection area of the sub-deflector of the three-dimensional shaping apparatus according to the first embodiment of the present invention.

FIG. 4 is a view showing another example of the deflection area (two-dimensional) of the sub-deflector 103 of the three-dimensional shaping apparatus 100 according to this embodiment. In the above operation, the deflection area of the sub-deflector 103 may be two-dimensional, as shown in FIG. 4. The scanning speed of the sub-deflector 103 may be set high in the X direction and low in the Y direction, as shown in 410 of FIG. 4, or may be set low in the X direction and high in the Y direction, as shown in 420 of FIG. 4. The sub-deflector 103 scans its entire deflection area to prevent the temperature distribution of the metal powder 130 in the deflection area from becoming uneven.

Comparing 310 and 320 of FIG. 3 with 410 and 420 of FIG. 4 in the above view point derives a requirement on the deflection area of the sub-deflector 103 for preventing overheating of the metal powder 130. The requirement is that the deflection area of the sub-deflector 103 has a nonzero width in the X direction, the width excluding the diameter of the electron beam 120. When this requirement is satisfied, the sub-deflector 103 diffuses excessive heat given by the electron beam 120 to the metal powder 130. The size of the heat diffusion area is determined by the width of the deflection area of the sub-deflector 103, and increasing the diffusion area decreases the temperature rise of the metal powder 130.

FIG. 5 is a view showing points at which the speed vector of the scan by the main deflector 102 of the three-dimensional shaping apparatus 100 is changed. In the above requirement, the X direction is a direction perpendicular to the direction in which the following points are arranged (Y direction): the points where, within the region where the metal powder 130 is melted, the speed vector of the scan by the main deflector 102 is changed, that is, the points where the metal powder 130 can be overheated unless the sub-deflector 103 is operated. The direction in which the points where the speed vector of the scan by the main deflector 102 is changed are arranged (Y direction) is the direction of the line segments represented by the dotted lines 501. That is, the requirement can also be that the deflection area of the sub-deflector 103 has a nonzero width in the direction perpendicular to the arrangement direction of the points where the speed vector of the scan by the main deflector 102 is changed.

As described above, according to this embodiment, one can, after the scanning signal input to the main deflector 102 starts or restarts, prevent the metal powder 130 in the region which receives the electron beam 120 from being overheated and suffering from unintended melting which degrades the shaping accuracy.

Second Embodiment

Figure 6:
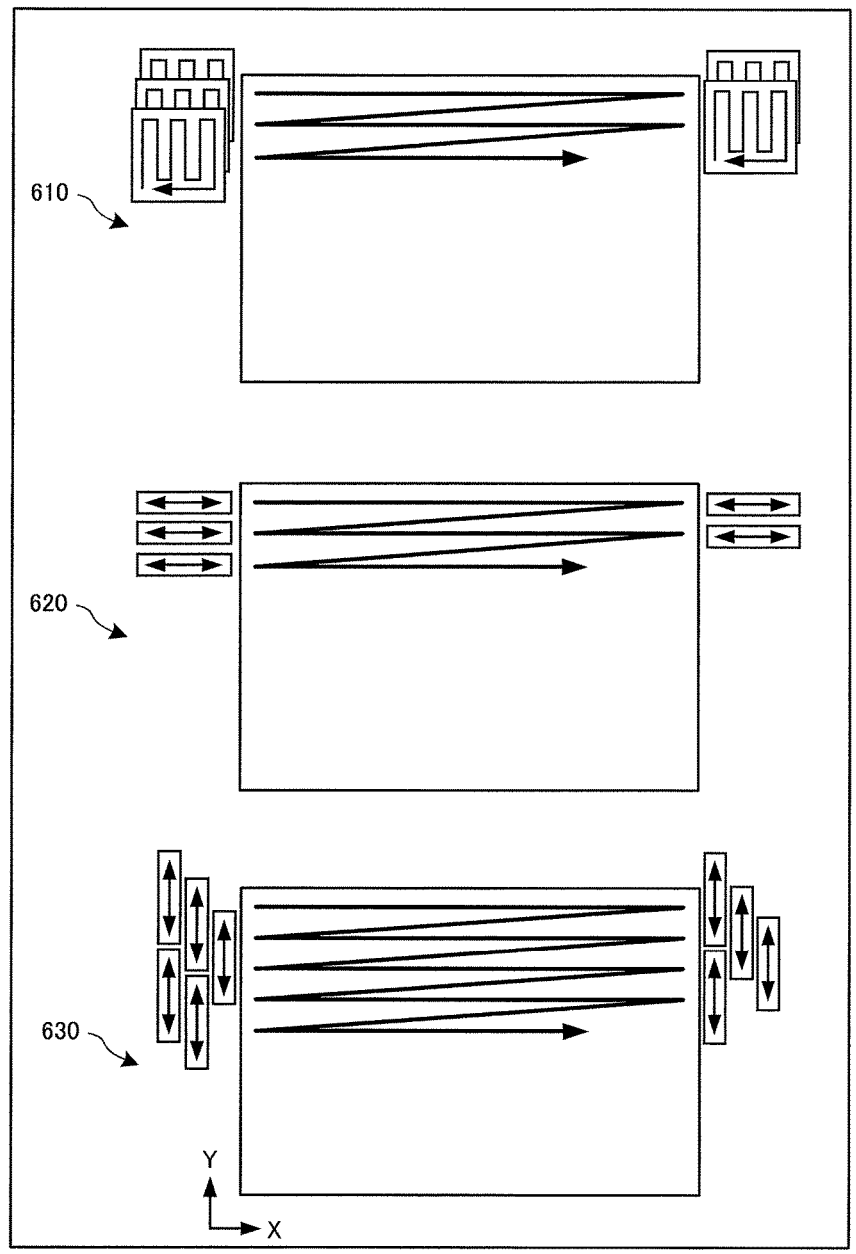
FIG. 6 is a view explaining an example of the deflection area of the sub-deflector of a three-dimensional shaping apparatus according to the second embodiment of the present invention.

The operation of a three-dimensional shaping apparatus according to the second embodiment of the present invention will be described with reference to FIG. 6. FIG. 6 is a view explaining an example of the deflection area of the sub-deflector of the three-dimensional shaping apparatus according to this embodiment. The three-dimensional shaping apparatus according to this embodiment is different from that according to the first embodiment in that in the former, unlike in the latter, the scanning area of the sub-deflector falls outside the regions where metal powder is melted. The other aspects of the components and operations in this embodiment are the same as those in the first embodiment. Hence, the same reference numerals denote the same components and operations, and a detailed description thereof will be omitted.

In the first embodiment, as is apparent from FIGS. 3 and 4, the deflection area of the sub-deflector 103 overlaps the region where the metal powder 130 is melted. This is because in the first embodiment, the incident position of the electron beam 120, before the sub-deflector 103 is operated to diffuse the heat given to the metal powder 130, coincides with the center of the deflection area of the sub-deflector 103. Note that before the sub-deflector 103 is operated, the scanning signal input to the sub-deflector 103 is zero, as described above.

If the sub-deflector 103 is operated under the above condition, excessive heat given to the metal powder 130 is diffused but the diffused heat is, by the overlapping amount, given back to the region where the metal powder 130 is melted. Consequently, the region where the metal powder 130 is melted is nonetheless overheated, although partially and mildly.

To prevent this, it is preferable that the deflection area of the sub-deflector 103 does not overlap the region where the metal powder 130 is melted. As shown in FIG. 6, in this embodiment, the areas scanned by the sub-deflector 103 are set to fall outside the region where metal powder 130 is melted.

The above scan by the sub-deflector 103 can be performed by having the sub-deflector 103 deflect the electron beam 120 when or immediately before starting the operation the sub-deflector 103 to diffuse heat at points where the speed vector of the scan by the main deflector 102 is changed. This shifts the center of the deflection area of the sub-deflector 103 to outside the region where the metal powder 130 is melted. That is, the above scan can be performed by combining the scanning signal input to the sub-deflector 103 with a deflection signal corresponding to the shift of the scanning area of the sub-deflector 103.

Note here that, as in the first embodiment, the deflection area of the sub-deflector 103 is set to have a nonzero width (excluding the diameter of the electron beam 120) in the X direction, that is, in the direction perpendicular to the arrangement direction of the points where the speed vector of the scan by the main deflector 102 is changed, as shown in 610 and 620 of FIG. 6.

Also note here that the deflection area of the sub-deflector 103 does not have to have a nonzero width in the X direction if such a measure as the following is taken: the center of the deflection area of the sub-deflector 103, which area is in this case still one-dimensional and but has a nonzero width in the Y direction, is shifted to a different X-coordinate every time the direction of the scan by the main deflector 102 is reversed, as shown in 630 of FIG. 6. This eventually diffuses the heat given to the metal powder 130. Here, the deflection area of the sub-deflector 103 can be regarded as equivalently having a nonzero width in the X direction, that is, in the direction perpendicular to the arrangement direction of the points where the speed vector of the scan by the main deflector 102 is changed.

As described above, according to this embodiment, the scanning area of the sub-deflector falls outside the region where the metal powder is melted. Therefore, according to this embodiment, one can suppress overheating of and unintended melting of the metal powder in the region where the metal powder is melted and thereby can improve the shaping accuracy.

Third Embodiment

Figure 7:
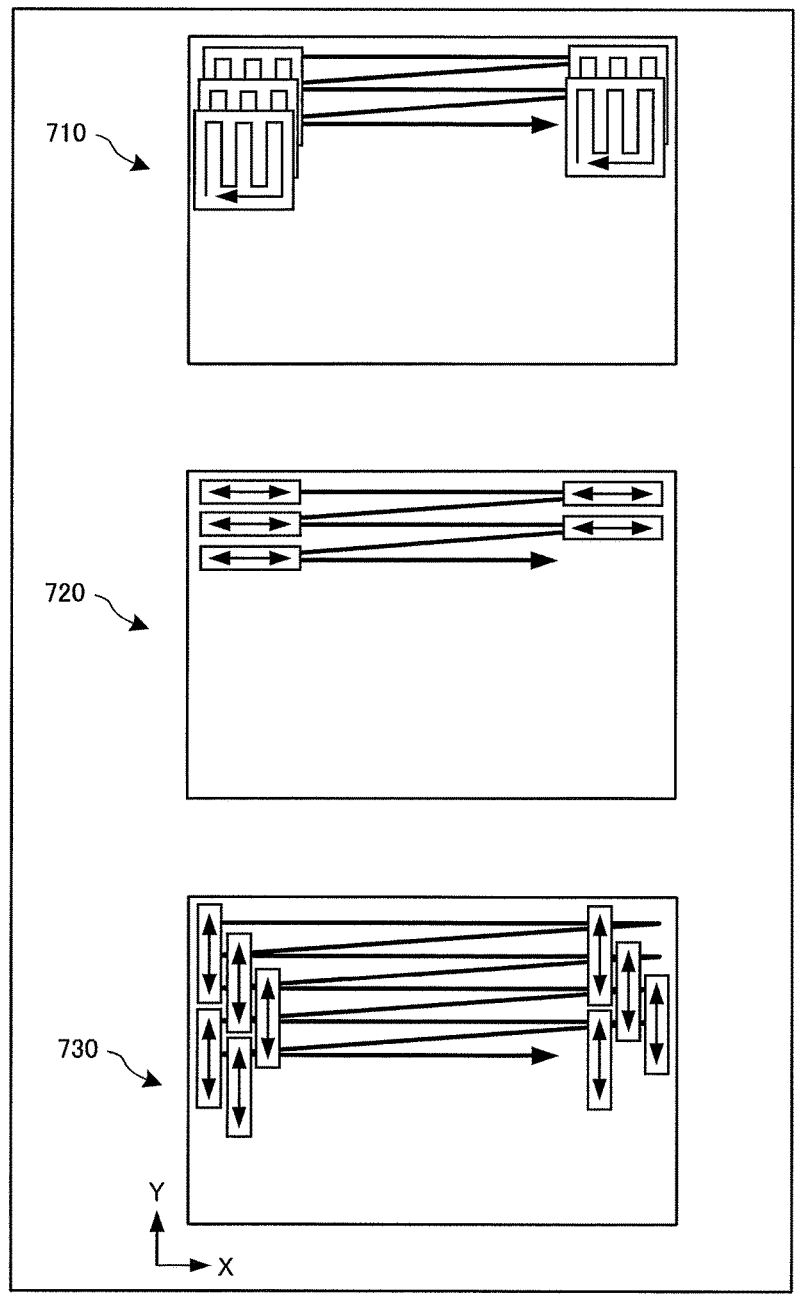
FIG. 7 is a view explaining an example of the deflection area of the sub-deflector of a three-dimensional shaping apparatus according to the third embodiment of the present invention.

The operation of a three-dimensional shaping apparatus according to the third embodiment of the present invention will be described with reference to FIG. 7. FIG. 7 is a view explaining an example of the deflection area of the sub-deflector of the three-dimensional shaping apparatus according to this embodiment. The three-dimensional shaping apparatus according to this embodiment is different from those according to the first and second embodiments in that in the former, unlike in the latter, the scanning area of the sub-deflector falls within the regions where metal powder is melted. The other aspects of the components and operations in this embodiment are the same as those in the first and second embodiment. Hence, the same reference numerals denote the same components and operations, and a detailed description thereof will be omitted.

In the first embodiment, the deflection area of the sub-deflector partially overlaps the region where the metal powder is melted, and in the second embodiment, the scanning area falls outside the region where the metal powder is melted. In this embodiment, as shown in FIG. 7, the entire area scanned by a sub-deflector 103 is set to fall within the region where metal powder 130 is melted. More preferably, the entire area scanned by the sub-deflector 103 is separated as much as possible from the boundary between the region where the metal powder 130 is melted and the region where the metal powder 130 is not melted.

The above scan can be executed by, when or immediately before the operation of the sub-deflector 103 is started to diffuse the heat given to the metal powder 130, deflecting the electron beam 120 with the sub-deflector 103 so that the center of the deflection area of the sub-deflector 103 is shifted toward the inner part of the region where the metal powder 130 is melted. For the deflection, that is, for the shift of the center of the deflection area of the sub-deflector 103, the scanning signal input to the sub-deflector 103 is combined with a deflection signal corresponding to the shift.

This degrades, to some extent, the effect of suppressing the evaporation of the metal powder 130 in the region where the metal powder 130 is melted, which evaporation is due to the metal powder 130 being overheated, but suppresses excessive heat from being transferred to outside the region where the metal powder 130 is melted, that is, to the region where the metal powder 130 is not melted. This suppression improves the position accuracy of the boundary between the region where the metal powder 130 is melted and the region where the metal powder 130 is not melted.

Note here that, as in the first and second embodiments, the deflection area of the sub-deflector 103 is set to have a nonzero width in the X direction, that is, in the direction perpendicular to the arrangement direction of points where the speed vector of the scan by the main deflector 102 is changed, as shown in 710 and 720 of FIG. 7. Also note here that, as in the second embodiment, the deflection area of the sub-deflector 103 does not have to have a nonzero width in the X direction if the deflection area of the sub-deflector 103 has a nonzero width in the Y direction and if the center of the deflection area of the sub-deflector 103 is shifted to a different X-coordinate every time the direction of the scan by the main deflector 102 is reversed, as shown in 730 of FIG. 7.

As described above, according to this embodiment, the scanning area of the sub-deflector falls within the region where the metal powder is melted. Therefore, according to this embodiment, the position accuracy of the boundary between the region where the metal powder is melted and the region where the metal powder is not melted is improved.

Fourth Embodiment

Figure 8:
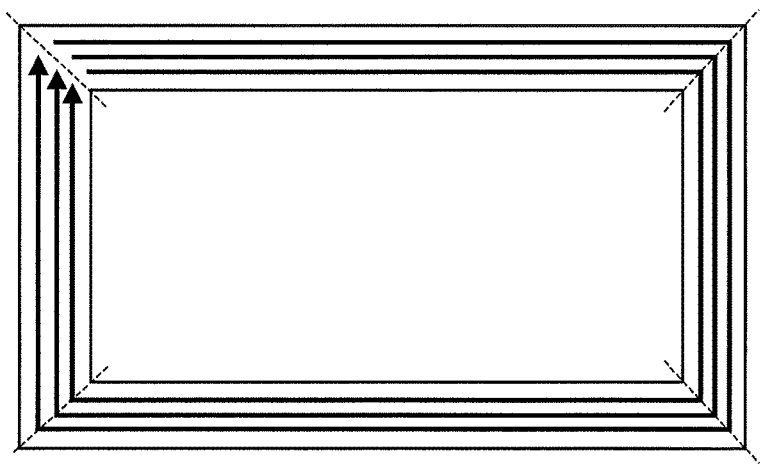
FIG. 8 is a view explaining a region scanned by a three-dimensional shaping apparatus according to the fourth embodiment of the present invention.

The operation of a three-dimensional shaping apparatus according to the fourth embodiment of the present invention will be described with reference to FIGS. 8 and 9. FIG. 8 is a view explaining a region scanned by the three-dimensional shaping apparatus according to this embodiment. The three-dimensional shaping apparatus according to this embodiment is different from those according to the first to third embodiments in that in the former, unlike in the latter, the direction of the scans by the main deflector is rotated by an angle of other than 180°. The other aspects of the components and operations are the same as those in the second embodiment. Hence, the same reference numerals denote the same components and operations, and a detailed description thereof will be omitted.

In the first to third embodiments, the sub-deflector 103 is operated when the direction of the scan by the main deflector 102 is reversed, that is, when the direction is rotated by 180°. In this embodiment, the sub-deflector 103 is also operated when the direction of the scans by the main deflector 102 is rotated by an angle of other than 180°. The operations of the main deflector 102 and sub-deflector 103 according to this embodiment will be described with reference to FIGS. 8 and 9.

The regions to be scanned in this embodiment each are a region where the metal powder 130 is melted and which can each be seen as the logical difference between two differently sized rectangles having the same center, as will be apparent from FIG. 8. The scan of each region is such that the electron beam 120 is, along the direction of the sides of the rectangles, circulated continuously through the long, narrow paths between the sides of the rectangles without passing through any region where the metal powder 130 is not melted, that is, any region but the long, narrow paths. During the scan, the direction of the scan by the main deflector 102 is rotated by 90° at each of the four corners of each region.

FIG. 9 is a view explaining the operation of the three-dimensional shaping apparatus according to this embodiment. In FIG. 9, 910 is a timing chart representing the timings of the scanning signal inputs to the main deflector 102 and sub-deflector 103, and the timing of the melting, and 920 is a timing chart showing the relationship between the time and the deflection positions X and Y determined by the main deflector 102. In 920 of FIG. 9, the solid line 901 indicates the relationship between the time and the actual deflection position X of the electron beam 120, and the broken line 902 indicates the relationship between the time and the ideal deflection position X of the electron beam 120. In 920 of FIG. 9, the solid line 903 indicates the relationship between the time and the actual deflection position Y of the electron beam 120, and the broken line 904 indicates the relationship between the time and the ideal deflection position Y of the electron beam 120. In FIG. 9, in addition, 930 is a view showing a region scanned by the main deflector 102, as with FIG. 8.

In the above-described scan, the scanning direction is rotated by 90° every time the direction of the sides of the rectangles changes by 90° along with the progress of the scan by the main deflector 102. At the same time, the operation of the sub-deflector 103 starts. Details thereof are as follows.

As shown in 910 and 920 of FIG. 9, before time t0, the scanning signal input to the main deflector 102 is off but the scanning signal input to the sub-deflector 103 is on. At time t0, the X-direction scanning signal input to the main deflector 102 is turned on to start the X-direction scan by the main deflector 102. After that, at time t1, the scanning signal input to the sub-deflector 103 is turned off to start the melting of the metal powder 204. At time t2, the scanning signal input to the main deflector 102 is turned off. At time t3, the scanning signal input to the sub-deflector 103 is turned on to end the melting. Next, at time t3, the Y-direction scanning signal input to the main deflector 102 is turned on to start the Y-direction scan by the main deflector 102. At time t4, the scanning signal input to the sub-deflector 103 is turned off to restart the melting of the metal powder 130. At time t5, the Y-direction scanning signal input to the main deflector 102 is turned off. At time t6, the scanning signal input to the sub-deflector 103 is turned on to end the melting. At time t6, in addition, the X-direction scanning signal input is turned on to restart the X-direction scan by the main deflector 102. However, the direction of the X-direction scanning signal input to the main deflector 102 at time t6 is reversed with respect to that at time t0.

After the X-direction scan by the main deflector 102 starts as described above, that is, after the X-direction scanning signal input to the main deflector 102 starts (from time t0 to t1), and after the Y-direction scan by the main deflector 102 starts as described above, that is, after the Y-direction scanning signal input to the main deflector 102 starts (from time t3 to t4), the deflection position X (solid line 901) and deflection position Y (solid line 903) determined by the main deflector 102 are delayed with respect to the ideal deflection position X (broken line 902) and deflection position Y (broken line 904), as shown in 920 of FIG. 9. As a result, the deflection by the main deflector 102 continues for a period equal to the above delay time even after the scanning signal input to the main deflector 102 is stopped (from time t2 to t3 and from time t5 to t6), and finally the deflection position converges to the target position.

In the above operation, the timing at which the X- or Y-direction scanning signal input to the main deflector 102 starts or restarts is the timing at which the scanning direction is changed, that is, the timing at which the speed vector of the scan by the main deflector 102 is changed. Therefore, in this embodiment, as in the first to third embodiments, it is after the speed vector of the scan by the main deflector 102 is changed that the sub-deflector 103 is operated.

By operating the sub-deflector 103 at the above timing, one can suppress overheating of the metal powder 130 caused when the scanning speed of the main deflector 102 is temporarily low due to a change in the scanning vector. Furthermore, by, as in the first embodiment, stopping the scanning signal input temporarily and allowing the deflection position to converge to the target position before the direction of the scan by the main deflector 102 is changed, one can improve the position accuracy of the boundary between the region where the metal powder 130 is melted and the region where the metal powder 130 is not melted, thereby increasing the shaping accuracy.

In this embodiment, as in the first embodiment, the deflection area of the sub-deflector 103 can either be one- or two-dimensional. When the deflection area is one-dimensional, the deflection area of the sub-deflector 103 is, as in the first embodiment, set to have a nonzero width in the direction perpendicular to the arrangement direction of points where the speed vector of the scan by the main deflector 102 is changed. Note that in this embodiment the arrangement direction of the points where the speed vector of the scan by the main deflector 102 is changed corresponds to the direction of each of the line segments shown by the dotted lines in FIG. 8. Also note that, as in the second and third embodiments, the scanning signal input to the sub-deflector 103 may, as needed, be combined with a deflection signal for shifting the center of the deflection area of the sub-deflector 103.

In the above descriptions, the direction of the scan by the main deflector 102 is rotated by 90°. However, the above-described operations of the main deflector 102 and sub-deflector 103 are effective even if the direction of the scan by the main deflector 102 is rotated by an angle of other than 90°, for example, 45°, and are also effective if the scanning speed of the main deflector 102 is changed without changing the direction of the scan by the main deflector 102. That is, the above-described operations of the main deflector 102 and sub-deflector 103 are also effective when the speed vector of the scan by the main deflector 102 is changed.

As described above, in this embodiment, the sub-deflector is operated even when the scanning direction of the main deflector is rotated by an angle of other than 180°. Therefore, according to this embodiment, the position accuracy of the boundaries between the regions where the metal powder is melted and the regions where the metal powder is not melted is improved regardless of the shapes of the regions where the metal powder is melted, and thus the shaping accuracy is increased.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to a system including a plurality of devices or a single apparatus. The present invention is also applicable even when an information processing program for implementing the functions of the embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described embodiments.

The invention claimed is:
1. A three-dimensional shaping apparatus comprising:
an electron gun that generates an electron beam;
at least one primary deflector that deflects the electron beam one- or two-dimensionally;
at least one lens that is provided between said electron gun and said at least one primary deflector, and that focuses the electron beam onto a plane which is scanned by the electron beam and which is loaded and covered with powder to be heated by the electron beam;
a secondary deflector that is provided between said electron gun and said at least one primary deflector, and that deflects the electron beam one- or two-dimensionally; and
a controller that gives said at least one primary deflector a signal with which to cause said at least one primary deflector to deflect the electron beam one- or two-dimensionally, and that also gives said secondary deflector a signal with which to cause said secondary deflector to deflect the electron beam one- or two-dimensionally, and that thereby causes said at least one primary deflector and said secondary deflector to keep or change a speed vector with which the electron beam scans said plane,
wherein said controller causes said secondary deflector to continue to deflect the electron beam dynamically so that the electron beam continues to scan an area in said plane, during a period during which a speed at which the electron beam scans said plane when deflected by said at least one primary deflector is lower than a predetermined speed, said period occurring as a result of said controller causing said at least one primary deflector to change the speed vector with which the electron beam scans said plane, and wherein said controller thereby causes heat given by the electron beam to the powder during said period to be diffused over said area, so as to prevent overheating of the powder in at least one region which is part of said plane and where the powder is to be melted by the electron beam.

2. The three-dimensional shaping apparatus according to claim 1, wherein said controller controls said at least one primary deflector and said secondary deflector so that a speed at which the electron beam scans said plane when deflected by said secondary deflector is higher than the speed at which the electron beam scans said plane when deflected by said at least one primary deflector.

3. The three-dimensional shaping apparatus according to claim 1, wherein said controller controls said secondary deflector so that said area falls outside the at least one regions.

4. The three-dimensional shaping apparatus according to claim 1, wherein said controller controls said secondary deflector so that said area falls within the at least one regions.

5. The three-dimensional shaping apparatus according to claim 1, wherein said controller temporarily stops changing the intensity of the signal with which to cause said at least one primary deflector to deflect the electron beam one- or two-dimensionally, and thereby temporarily stops causing said at least one primary deflector to deflect the electron beam dynamically, before causing said at least one primary deflector to change the speed vector with which the electron beam scans said plane, so as to allow the position of the electron beam on said plane to converge to a target position.

6. The three-dimensional shaping apparatus according to claim 1, wherein said controller controls said secondary deflector so that said area has a predetermined width in a predetermined direction.

7. The three-dimensional shaping apparatus according to claim 6, wherein the predetermined direction is perpendicular to a direction in which said controller arranges a series of contiguous points where said controller causes said at least one primary deflector to change the speed vector with which the electron beam scans said plane.

* * * * *